United States Patent
Huang

(10) Patent No.: US 8,274,217 B2
(45) Date of Patent: Sep. 25, 2012

(54) LED PACKAGE HAVING LENS, TRANSPARENT ADHESIVE AND PHOSPHOR LAYERS

(75) Inventor: Hsin-Fei Huang, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 61 days.

(21) Appl. No.: 12/938,377

(22) Filed: Nov. 3, 2010

(65) Prior Publication Data
US 2012/0038268 A1    Feb. 16, 2012

(30) Foreign Application Priority Data
Aug. 13, 2010    (TW) ............................... 99127051 A

(51) Int. Cl.
*H01J 1/62*    (2006.01)
(52) U.S. Cl. ....................................... 313/506; 313/512
(58) Field of Classification Search ........... 313/498–512
See application file for complete search history.

(56) References Cited

U.S. PATENT DOCUMENTS

| | | | | |
|---|---|---|---|---|
| 6,252,254 | B1 * | 6/2001 | Soules et al. | 257/89 |
| 6,734,465 | B1 * | 5/2004 | Taskar et al. | 257/80 |
| 6,833,565 | B2 * | 12/2004 | Su et al. | 257/98 |
| 7,259,400 | B1 * | 8/2007 | Taskar | 257/98 |
| 7,344,902 | B2 * | 3/2008 | Basin et al. | 438/27 |
| 2005/0221519 | A1 * | 10/2005 | Leung et al. | 438/27 |
| 2006/0105484 | A1 * | 5/2006 | Basin et al. | 438/27 |
| 2008/0048200 | A1 * | 2/2008 | Mueller et al. | 257/98 |

* cited by examiner

*Primary Examiner* — Bumsuk Won
(74) *Attorney, Agent, or Firm* — Altis Law Group, Inc.

(57) ABSTRACT

A LED package includes a LED chip, a first phosphor layer, a second phosphor layer, a transparent adhesive and a lens. The lens includes an inner surface and an exterior surface. The first phosphor layer is mounted on the LED chip. The transparent adhesive is filled between the LED chip and the lens. The second phosphor layer is mounted on one of the inner surface and the exterior surface of the lens. Each of the first phosphor layer and the second phosphor layer is of one color.

5 Claims, 3 Drawing Sheets

LED PACKAGE HAVING LENS, TRANSPARENT ADHESIVE AND PHOSPHOR LAYERS

BACKGROUND

1. Technical Field

The disclosure relates generally to semiconductor devices, and more particularly to a LED package.

2. Description of the Related Art

A LED chip with a phosphor layer is a cost-effective method of generating light of a specific color. A LED chip is normally coated with one phosphor layer determining the light color. However, a phosphor of specifically defined color is difficult to manufacture.

Thus, what is called for is a LED package with multiple phosphor layers that can alleviate the limitations described.

DETAILED DESCRIPTION

Figure 1:
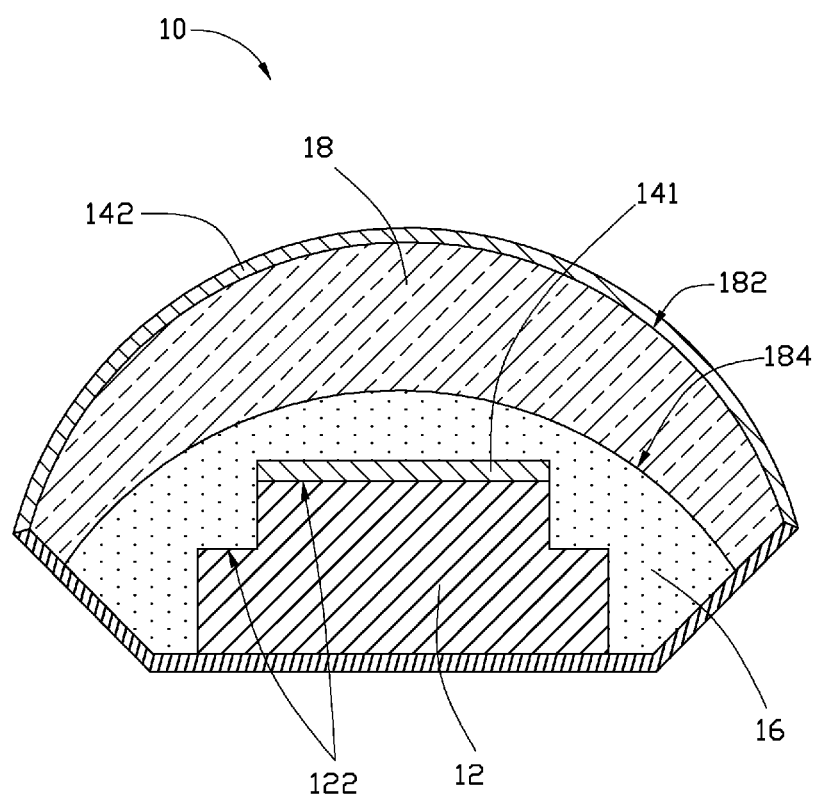
FIG. 1 is a cross-section of a LED package in accordance with one embodiment of the disclosure.
Figure 2:
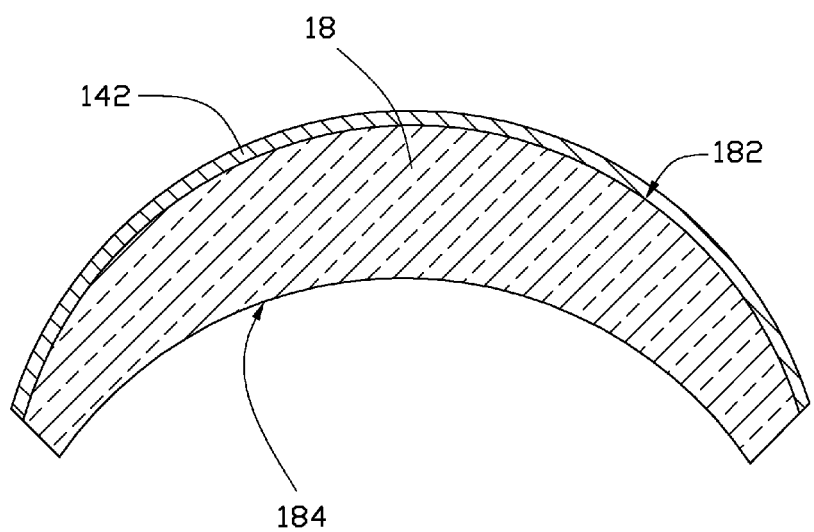
FIG. 2 is a cross-section of a lens and a second phosphor layer of the LED package in FIG. 1.

Referring to FIGS. 1-2, a LED package 10 in accordance with one embodiment of the disclosure includes a LED chip 12, a first phosphor layer 141, a second phosphor layer 142, a transparent adhesive 16 and a lens 18.

The LED chip 12 has a light emitting surface 122 on which the first phosphor layer 141 is mounted. The first phosphor layer 141 covers a part of the light emitting surface 122. The transparent adhesive 16 is filled between the LED chip 12 and the lens 18 and covers the first phosphor layer 141. The second phosphor layer 142 is mounted on an inner surface 184 or an exterior surface 182 of the lens 18. In the embodiment, the phosphor layer 14 is mounted on the exterior surface 182.

The colors of the first phosphor layer 141 and the second phosphor layer 142 are different. The light from the LED chip 12 can be modulated through the first phosphor layer 141 and the second phosphor layer 142. Thus, the light color emitting from the LED package 10 can be varied according to the phosphor layers 141, 142.

Figure 3:
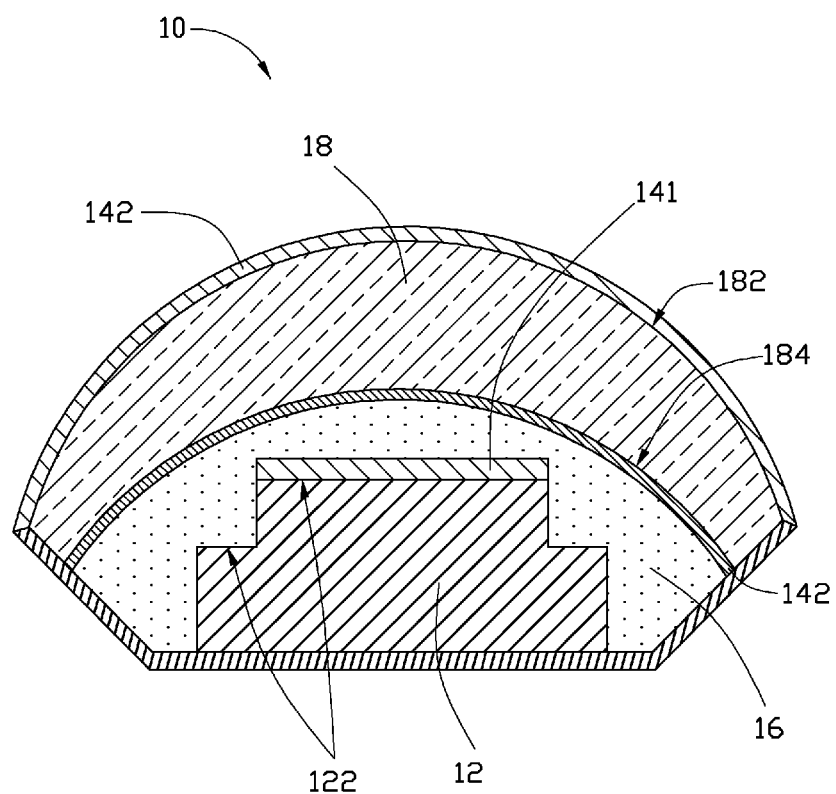
FIG. 3 is a cross-section of an LED package in accordance with an alternative embodiment of the disclosure.

The number of phosphor layers can be determined according to specific request, not being limited to the number disclosed. For example, there can be two second phosphor layers 142 respectively mounted on the inner surface 184 and the exterior surface 182 of the lens 18 as shown in FIG. 3. The first phosphor layer 141 and the second phosphor layer 142 include sulfides, aluminates, oxides, silicates, nitrides, $Ca_2Al_{12}O_{19}$:Mn, $(Ca,Sr,Ba)Al_2O_4$:Eu, $3Al_5O_{12}$:$Ce^{3+}$(YAG) $Tb_3Al_5O_{12}$:$Ce^{3+}$(TAG), $BaMgAl_{10}O_{17}$:$Eu^{2+}(Mn^{2+})$, $Ca_2Si_5N_8$:$Eu^{2+}$, $(Ca,Sr,Ba)S$:$Eu^{2+}$, $(Mg,Ca,Sr,Ba)2SiO_4$:$Eu^{2+}$, $(Mg,Ca,Sr,Ba)3Si_2O_7$:$Eu^{2+}$, $Ca_8Mg(SiO_4Cl_2$:$Eu^{2+}$, $(Sr,Ca,Ba)Si_xO_yN_z$:$Eu^{2+}$, $Y_2O_2S$:$Eu^{3+}$, $(Ca,Mg,Y)Si_wAl_xO_yN_z$:$Eu^{2+}$, CdS, CdTe or CdSe.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An LED package comprising:
   a LED chip configured for emitting light;
   a first phosphor layer;
   a second phosphor layer;
   a transparent adhesive; and
   a lens comprising an inner surface and an exterior surface, the first phosphor layer mounted on a light emitting surface of the LED chip, the transparent adhesive filled between the LED chip and the lens and covering the first phosphor layer, the second phosphor layer mounted on one of the inner surface and the exterior surface of the lens, wherein each of the first phosphor layer and the second phosphor layer is configured to be of one color, and the first phosphor layer is mounted on and only covers a part of the light emitting surface of the LED chip.

2. The LED package as claimed in claim 1, wherein the transparent adhesive is transparent material.

3. The LED package as claimed in claim 1, wherein each of the first phosphor layer and the second phosphor layer comprises sulfides, aluminates, oxides, silicates, or nitrides.

4. The LED package as claimed in claim 1, wherein the first phosphor layer and the second phosphor layer comprise $Ca_2Al_{12}O_{19}$:Mn, $(Ca,Sr,Ba)Al_2O_4$:Eu, $3Al_5O_{12}$:$Ce^{3+}$(YAG) $Tb_3Al_5O_{12}$:$Ce^{3+}$(TAG), $BaMgAl_{10}O_{17}$:$Eu^{2+}(Mn^{2+})$, $Ca_2Si_5N_8$:$Eu^{2+}$, $(Ca,Sr,Ba)S$:$Eu^{2+}$, $(Mg,Ca,Sr,Ba)2SiO_4$:$Eu^{2+}$, $(Mg,Ca,Sr,Ba)3Si_2O_7$:$Eu^{2+}$, $Ca_8Mg(SiO_4Cl_2$:$Eu^{2+}$, $(Sr,Ca,Ba)Si_xO_yN_z$:$Eu^{2+}$, $Y_2O_2S$:$Eu^{3+}$, $(Ca,Mg,Y)Si_wAl_xO_yN_z$:$Eu^{2+}$, CdS, CdTe or CdSe.

5. An LED package comprising:
   at least one LED chip configured for emitting light;
   a first phosphor layer;
   two second phosphor layers;
   a transparent adhesive; and
   a lens comprising an inner surface and an exterior surface, the first phosphor layer mounted on a light emitting surface of the LED chip, the transparent adhesive filled between the at least one LED chip and the lens and covering the first phosphor layer, one of the two second phosphor layers mounted on the inner surface of the lens, the other of the second phosphor layers mounted on the exterior surface of the lens, wherein each of the first phosphor layer and the two second phosphor layers is configured to be of one color, and the first phosphor layer is mounted on and only covers a part of the light emitting surface of the LED chip.

* * * * *